US010033377B2

(12) United States Patent
Liang et al.

(10) Patent No.: US 10,033,377 B2
(45) Date of Patent: Jul. 24, 2018

(54) ADAPTIVE POWER DOWN CONTROL SYSTEM

(71) Applicant: Avago Technologies General IP (Singapore) Pte. Ltd., Singapore (SG)

(72) Inventors: Yunfeng Liang, Singapore (SG); Bin Zhang, Singapore (SG)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 15/070,503

(22) Filed: Mar. 15, 2016

(65) Prior Publication Data
US 2017/0272068 A1   Sep. 21, 2017

(51) Int. Cl.
| H03K 3/00 | (2006.01) |
| H03K 17/567 | (2006.01) |
| H03K 17/081 | (2006.01) |
| H03K 17/16 | (2006.01) |

(52) U.S. Cl.
CPC ..... H03K 17/567 (2013.01); H03K 17/08116 (2013.01); H03K 17/168 (2013.01)

(58) Field of Classification Search
CPC .............. H03K 17/168; H03K 17/0828; H03K 17/163; H03K 17/166; H03K 17/14; H03K 17/0406; H03K 17/0822; H03K 17/567; H03K 17/0412; H03K 17/18; H03K 17/082; H03K 2217/0027; H02M 1/08; H02M 1/32; H02M 2001/009; H02M 2001/0029

USPC .......................................................... 327/109
See application file for complete search history.

(56) References Cited

U.S. PATENT DOCUMENTS

| 6,275,093 | B1 * | 8/2001 | Shekhawat | ........ H03K 17/0828 |
| | | | | 327/432 |
| 7,741,894 | B2 | 6/2010 | Kojima | |
| 9,030,054 | B2 | 5/2015 | Jacobson et al. | |
| 2008/0106319 | A1 * | 5/2008 | Bayerer | ............. H03K 17/0406 |
| | | | | 327/432 |
| 2010/0194451 | A1 * | 8/2010 | Nuutinen | ........... H03K 17/0828 |
| | | | | 327/109 |
| 2012/0075761 | A1 * | 3/2012 | Miura | ...................... H02M 1/32 |
| | | | | 361/93.1 |
| 2012/0286752 | A1 * | 11/2012 | Tsukiji | .................. H02M 3/156 |
| | | | | 323/282 |
| 2013/0242438 | A1 * | 9/2013 | Fukuta | ................. H02H 1/0007 |
| | | | | 361/18 |
| 2014/0078629 | A1 * | 3/2014 | Cortigiani | .......... H03K 17/0822 |
| | | | | 361/79 |
| 2016/0013788 | A1 | 1/2016 | Thalheim | |

(Continued)

*Primary Examiner* — Patrick Chen
(74) *Attorney, Agent, or Firm* — Sheridan Ross P.C.

(57) ABSTRACT

Systems, circuits, and methods for operating an Insulated-Gate Bipolar Transistor (IGBT) are provided. A circuit is to include a first driver for the IGBT, the first driver having a first resistance and being connectable to the gate of the IGBT. The circuit is further described to include a second driver for the IGBT, the second driver having a second resistance different from the first resistance and also being connectable to the gate of the IGBT. The circuit is also described to include a controller that receives at least two inputs regarding operating characteristics of the IGBT and based on the at least two inputs decides whether to connect the first or second driver to the gate of the IGBT during power-down of the IGBT.

20 Claims, 7 Drawing Sheets

(56) References Cited

U.S. PATENT DOCUMENTS

2016/0036430 A1    2/2016  Rannestad
2016/0099665 A1*   4/2016  Chen .................. H03K 17/14
                                                    318/400.27

* cited by examiner

| Turn-Off Procedures | System |
|---|---|
| Normal Condition:<br>Desat false<br>OC false; SC false | Stage1: Rg-small for hard shutdown<br>Stage2: Rg-small for hard shutdown<br>Stage3: Final steady off state |
| OC condition:<br>Desat false<br>OC true; SC false | Stage1: Rg-small for hard shutdown<br>Stage2: Rg-medium for mild shutdown<br>Stage3: Final steady off state |
| SC Condition:<br>Desat false<br>OC true; SC true | Stage1: Rg-small for hard shutdown<br>Stage2: Rg-large for soft shutdown<br>Stage3: Final steady off state |
| Desat Condition:<br>Desat true;<br>(OC and SC true whenever Desat true) | Stage1: Rg-large for soft shutdown<br>Stage2: Final steady off state |

# ADAPTIVE POWER DOWN CONTROL SYSTEM

FIELD OF THE DISCLOSURE

The present disclosure is generally directed toward IGBT driver circuits and control systems therefor.

BACKGROUND

The Insulated-Gate Bipolar Transistor (IGBT) is a three-terminal power semiconductor device primarily used as an electronic switch and in newer devices is noted for combining high efficiency and fast switching. It switches electric power in many modern appliances such as: Variable-Frequency Drives (VFDs), electric cars, trains, variable speed refrigerators, lamp ballasts, air-conditioners, and even stereo systems with switching amplifiers.

IGBTs are often used for high voltage (e.g., greater than 600V) and high-current power converter applications. However, turning off IGBT in the system 100 of FIG. 1 becomes a tricky task because of the influence of IGBT's parasitic inductances on system behavior. The current change by turning off the IGBT 108 will cause voltage spikes at its collector.

Figure 1:
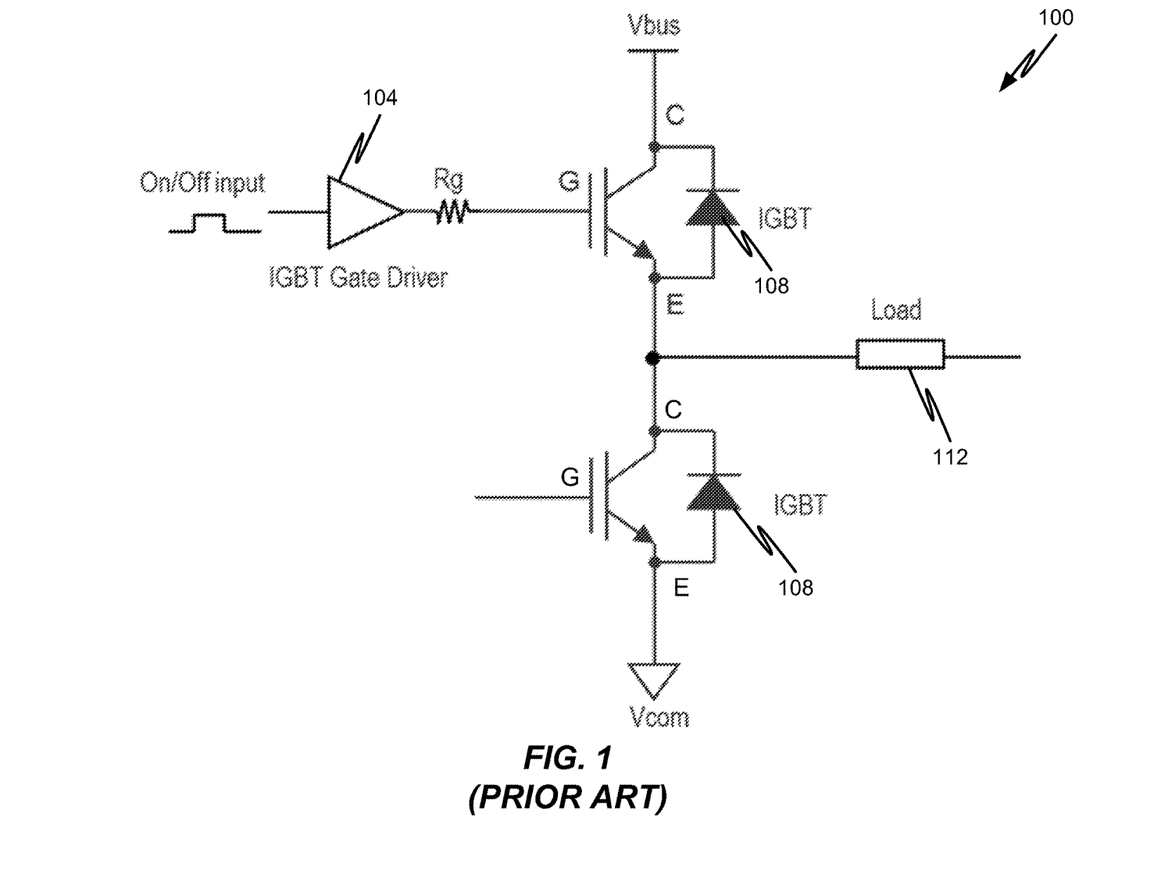
FIG. 1 is a circuit diagram depicting a first prior art circuit.

During normal powering down of the load 112, in order to achieve overall system efficiency, one has to keep the IGBT 108 switching energy loss minimum and Miller plateau short. In many implementations, a small gate resistor Rg and/or external buffer are used to achieve fast (hard) shut-down.

For higher overcurrent or short circuit conditions, a large gate resistor Rg is desired for slow (soft) shut-down to prevent the collector-to-emitter voltage of the IGBT 108 (Vce) transient from getting too high to exceed its absolute maximum rating. Unfortunately, this will result in an extended turn-off Miller plateau and higher switching losses for normal switching conditions. Hence, overall system efficiency is reduced.

Figure 2:
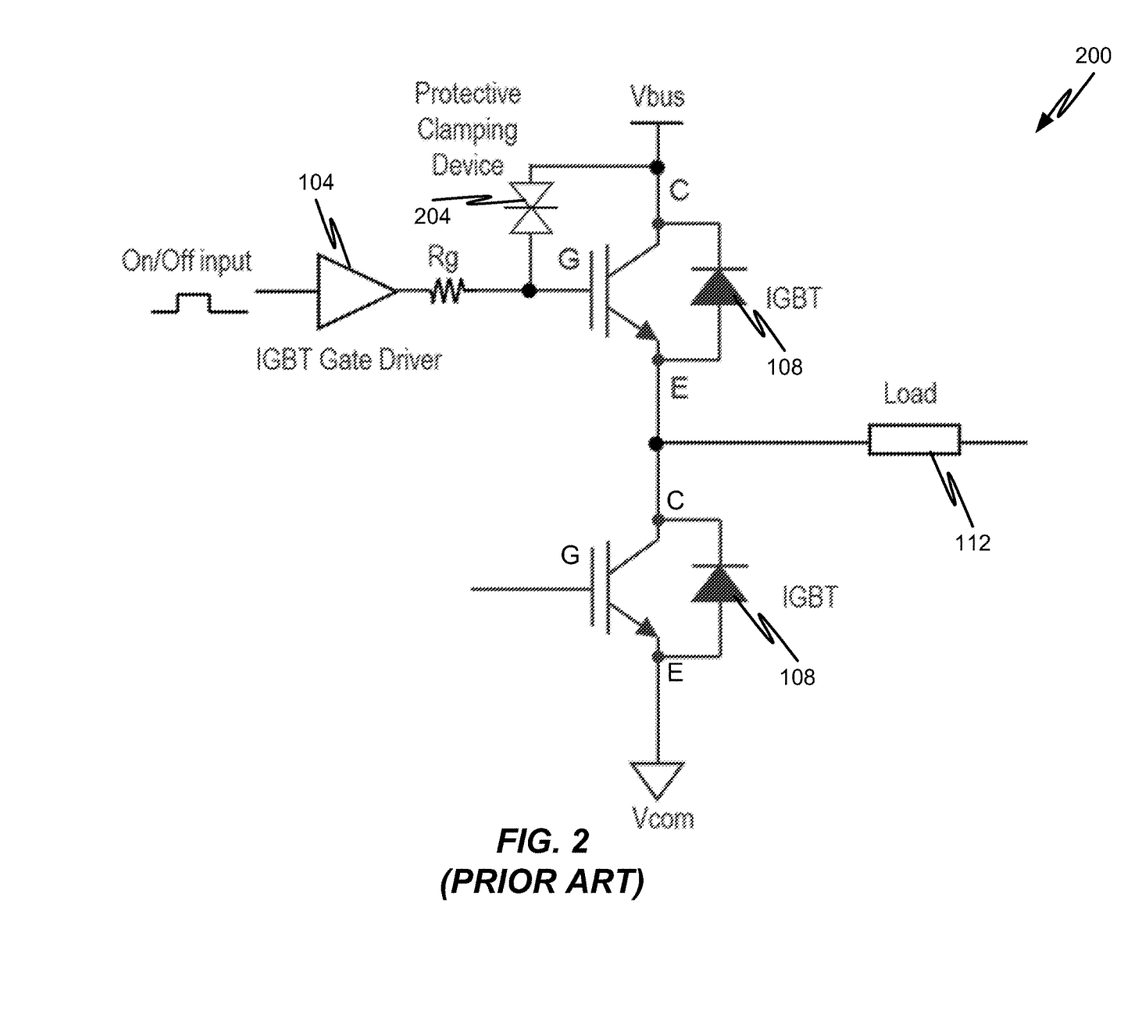
FIG. 2 is a circuit diagram depicting a second prior art circuit.

As shown in FIG. 2, some solutions employ a small resistor Rg to turn off for all current conditions, with the help of active clamping circuit 204 to prevent IGBT 108 from breakdown. Active clamping is implemented by feeding back the collector potential to the gate via an element 204 with avalanche characteristic, such as TVS.

A problem with such an approach is that the addition of the clamping device 204 reduces the effective working voltage of IGBT 108 and hence reduces operating efficiency. Another problem is that when the clamping device 204 is activated, high power loss is introduced by the device itself. High power dissipation of clamping device 204 will affect its lift time, and hence causes reliability issues to the driver system 200.

BRIEF DESCRIPTION OF THE DRAWINGS

The present disclosure is described in conjunction with the appended figures, which are not necessarily drawn to scale.

DETAILED DESCRIPTION

It is with respect to the above-noted challenges that embodiments of the present disclosure were contemplated. In particular, a system, circuits, and method of operating such circuits are provided that solve the drawbacks associated driver circuits of the prior art.

While embodiments of the present disclosure will primarily be described in connection with driver circuits for IGBTs or circuits containing IGBTs, it should be appreciated that embodiments of the present disclosure are not so limited.

Various aspects of the present disclosure will be described herein with reference to drawings that are schematic illustrations of idealized configurations. It should be appreciated that while particular circuit configurations and circuit elements are described herein, embodiments of the present disclosure are not limited to the illustrative circuit configurations and/or circuit elements depicted and described herein. Specifically, it should be appreciated that circuit elements of a particular type or function may be replaced with one or multiple other circuit elements to achieve a similar function without departing from the scope of the present disclosure.

It should also be appreciated that the embodiments described herein may be implemented in any number of form factors. Specifically, the entirety of the circuits disclosed herein may be implemented in silicon as a fully-integrated solution (e.g., as a single Integrated Circuit (IC) chip or multiple IC chips) or they may be implemented as discrete components connected to a Printed Circuit Board (PCB).

Some problems lead to selective-output power-down control systems, so as to reduce the current strength on clamping device when it is activated. At the moment turn-off begins, the most appropriate output driver with its associated gate resistor Rg is chosen by a fixed selection logic circuit, based on IGBT current conditions which are accessed by a sensing circuit. IGBT current conditions can be determined by collector-to-emitter voltages Vce or by monitoring collector-to-emitter current Ice.

Unfortunately, when a large gate resistance Rg is selected for large current condition to reduce Vce transient, the Miller plateau is extended, thereby allowing the IGBT current to increase for a longer than desirable period of time.

In accordance with at least some embodiments, an adaptive power down control system is provided. Embodiments of the present disclosure address and cure many problems found in prior art IGBT control systems. In particular, embodiments of the present disclosure suggest a fast turn-off during initial Miller plateau period, which can minimize Miller plateau incurred delay. Another aspect of the present disclosure is to utilize an adaptive pull down resistor selection according to IGBT current strength after the Miller plateau can reduce the collector-to-emitter voltage Vce transient with minimum trade-off in switching energy loss and speed. With a reduced Vce transient, the use of active clamping devices can be avoided and the problems associated therewith can also be avoided. Fast turn-off after IGBT current rolls off within nominal range can reduce IGBT tail current dissipation.

Figure 3:
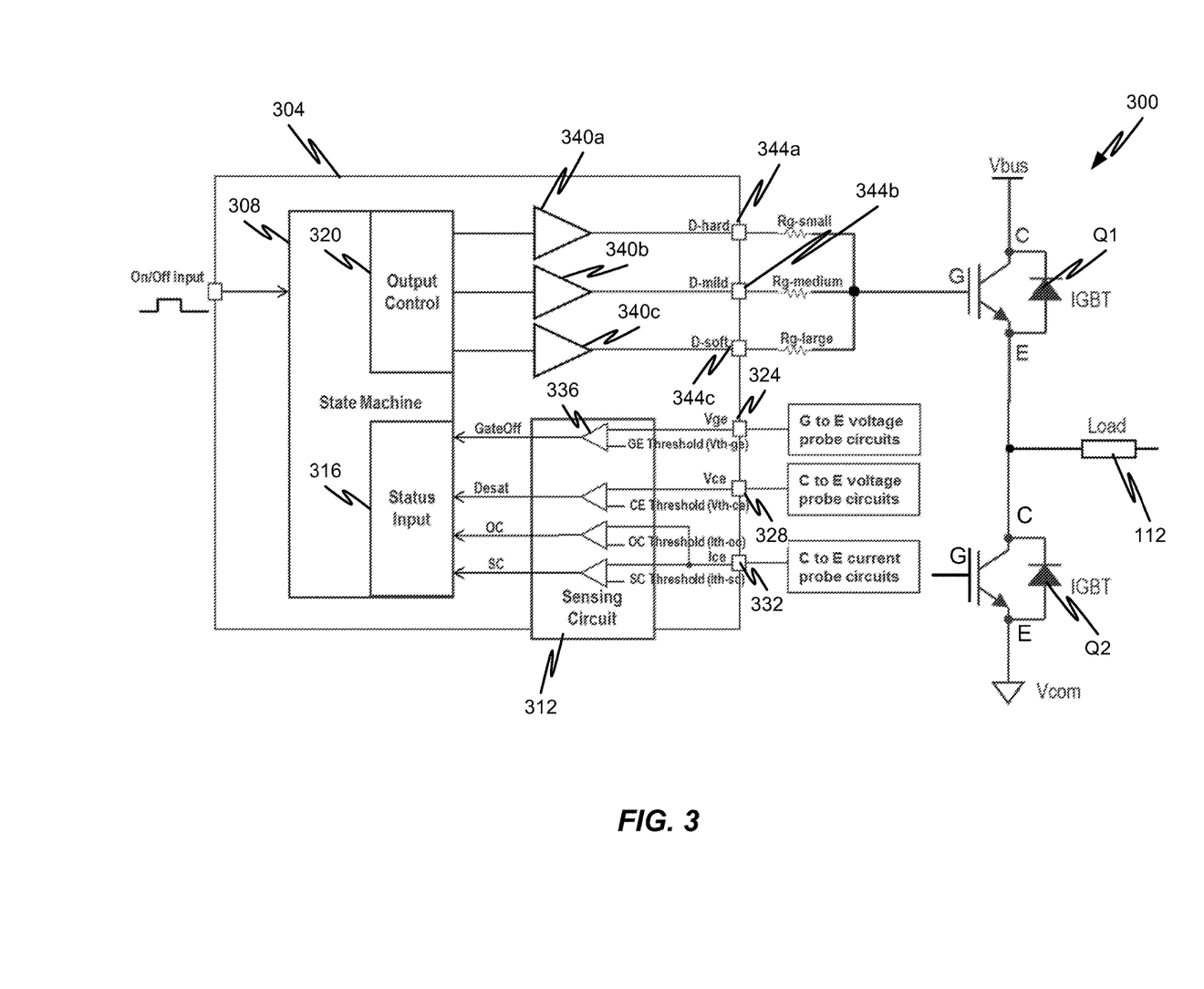
FIG. 3 is a circuit diagram depicting a first adaptive control system in accordance with at least some embodiments of the present disclosure.

With reference initially to FIG. 3, a first adaptive power down control system 300 will be described in accordance with at least some embodiments of the present disclosure. The system 300 may utilize a state machine 308 to dynamically select the driver Rg applied to the IGBT Q1. In some embodiments, the power down sequence is segmented into multiple stages, and the most appropriate driver resistor Rg to turn off the IGBT gate G at that stage is selected by the state machine 308.

In some embodiments, the state machine 308 is part of a larger controller 304 that receives inputs from various input sources and uses those inputs to control how the IGBT Q1 is driven. More specifically, the controller 304 is shown to include a plurality of inputs 324, 328, 332. These inputs may receive data regarding operating characteristics of the driven IGBT Q1. In the depicted embodiment, the first input 324 of the controller 304 receives a gate-to-emitter voltage Vge from a voltage probe circuit connected across the gate and emitter of IGBT Q1. The second input 328 of the controller 304 receives a collector-to-emitter voltage Vce from a voltage probe circuit connected across a collector and emitter of IGBT Q1. The third input 332 of the controller 304 receives a collector-to-emitter current Ice from a current probe circuit connected to the collector and/or emitter of IGBT Q1.

The input signals received at the first, second, and third inputs 324, 328, 332, of the controller 304 are then provided to the sensing circuit 312 of the controller 304. The sensing circuit 312 is shown to include a plurality of comparators 336 that are used to compare the various input signals to different thresholds. It should be appreciated that any type of comparator elements or combinations of elements (analog or digital) may be used to perform the comparisons described herein. In the depicted embodiment, the input signal received at the first input 324 is compared with a gate-emitter threshold to drive a GateOff signal. The input signal received at the second input 328 is compared with a collector-emitter threshold to drive a Desaturation signal (Desat). The input signal received at the third input 332 (e.g., the collector-to-emitter current Ice) is split and provided to two different comparators. The input signal received at the third input 332 is compared to both an overload current threshold as well as a short-circuit current threshold. In some embodiments, the overload current threshold is smaller than the short-circuit current threshold. The comparisons are used to drive an overload current and short-circuit signal, respectively.

It should be noted that in the depicted embodiment, the Desat signal will transmitted (e.g., correspond to a positive condition) when the collector-to-emitter voltage Vce is larger than the collector-emitter threshold. Likewise, the GateOff signal will be transmitted (e.g., correspond to a positive condition) when the gate-to-emitter voltage is smaller than the gate-emitter threshold. Continuing, the overload current signal will be false and the short-circuit current signal will be false (meaning both signals are not transmitted) when the collector-to-emitter current Ice is less than the overload current threshold. However, the overload current signal will be true but the short-circuit current signal will be false, resulting in transmission of the overload current signal, when the collector-to-emitter current Ice is between the overload current threshold and the short-circuit current threshold. Both the overload current signal and short-circuit current signal will be transmitted if the collector-to-emitter current is greater than the short-circuit current threshold, which is greater than the overload current threshold.

The GateOff, Desat, overload current, and short-circuit signals are provided from the sensing circuit 312 to the status input 316 of the state machine 308. The state machine 308 then considers (e.g., simultaneously and/or sequentially) the input signals to determine which of the drivers 340a, 340b, 340c to connect to the gate of the IGBT Q1. More specifically, the state machine 308 may be constructed using simple transistors and logic circuits. Alternatively or additionally, the state machine 308 may be constructed using one or multiple Erasable Programmable Read-Only Memory (EPROM), in which data is fed back to its addresses. The data indicates the state of the machine 308. Binary code may also be used to construct the state machine and the binary code may be implemented, again, using transistors or similar digital logic circuit elements.

Based on determinations made by the state machine 308, the drivers 340a, 340b, 340c are selectively and individually (e.g., only one at a time) provided with an output control signal from the output control 320 of the state machine 308. In other embodiments, two or more of the drivers 340a, 340b, 340c may be provided with an output control signal from the output control 320 of the state machine 308, thereby causing multiple drivers to connect with the gate of the IGBT Q1 at the same time.

The output control signal causes the state machine 308 to instruct one (or more) of the drivers 340a, 340b, 340c to become active and to turn off the gate of the IGBT Q1. Even more specifically, in some embodiments, one (or more) of the drivers 340a, 340b, 340c is provided with an activation signal (perhaps, but not necessarily, to the exclusion of the other drivers), thereby causing the driver(s) that receives the activation signal to provide a driving signal through its respective output 344a, 344b, 344c to the gate of the IGBT Q1. In some embodiments, each driver 340a, 340b, 340c has a differently-sized resistor residing between its output 344a, 344b, 344c, and the gate of the IGBT Q1. In some embodiments, two or more of the different gate resistors may have the same or a similar resistance. In such an embodiment (e.g., where there are two or more drivers connectable to the gate of the IGBT Q1 through a similarly or identically-sized resistor), both drivers could be activated for a hard shutdown and only one of the two drivers may be used to implement a soft shutdown.

Although embodiments of the present disclosure depict three different drivers 340a, 340b, 340c utilizing three different and separate outputs, it should be appreciated that embodiments of the present disclosure are not so limited. For instance, a greater or lesser number of drivers and/or output may be utilized and the number of drivers does not necessarily need to equal the number of outputs. As a non-limiting example, the output control 320 may provide an output control signal to a switching fabric that enables a selective connection of differently-sized resistors between a single driver and the gate of the IGBT Q1. In such a configuration, there may only be a single driver and a single output, but the switching fabric positioned between the driver and the output may connect different resistors or the same resistors in different combinations to adjust the gate resistance Rg that is connected to the gate of the IGBT Q1.

In some embodiments, the state machine 308 detects IGBT current and voltage conditions throughout the power down process of the IGBT Q1 by monitoring: (1) collectorto-emitter voltage Vce; (2) gate-to-emitter voltage Vge, and (3) collector-to-emitter current Ice. Whereas prior art control systems only consider IGBT status at the beginning of the turn-off process and only make a determination based on information available at a single instance of time, the state machine 308 disclosed herein is capable of responding to changes in the IGBTs Q1 behavior during the power down process.

Figure 4:
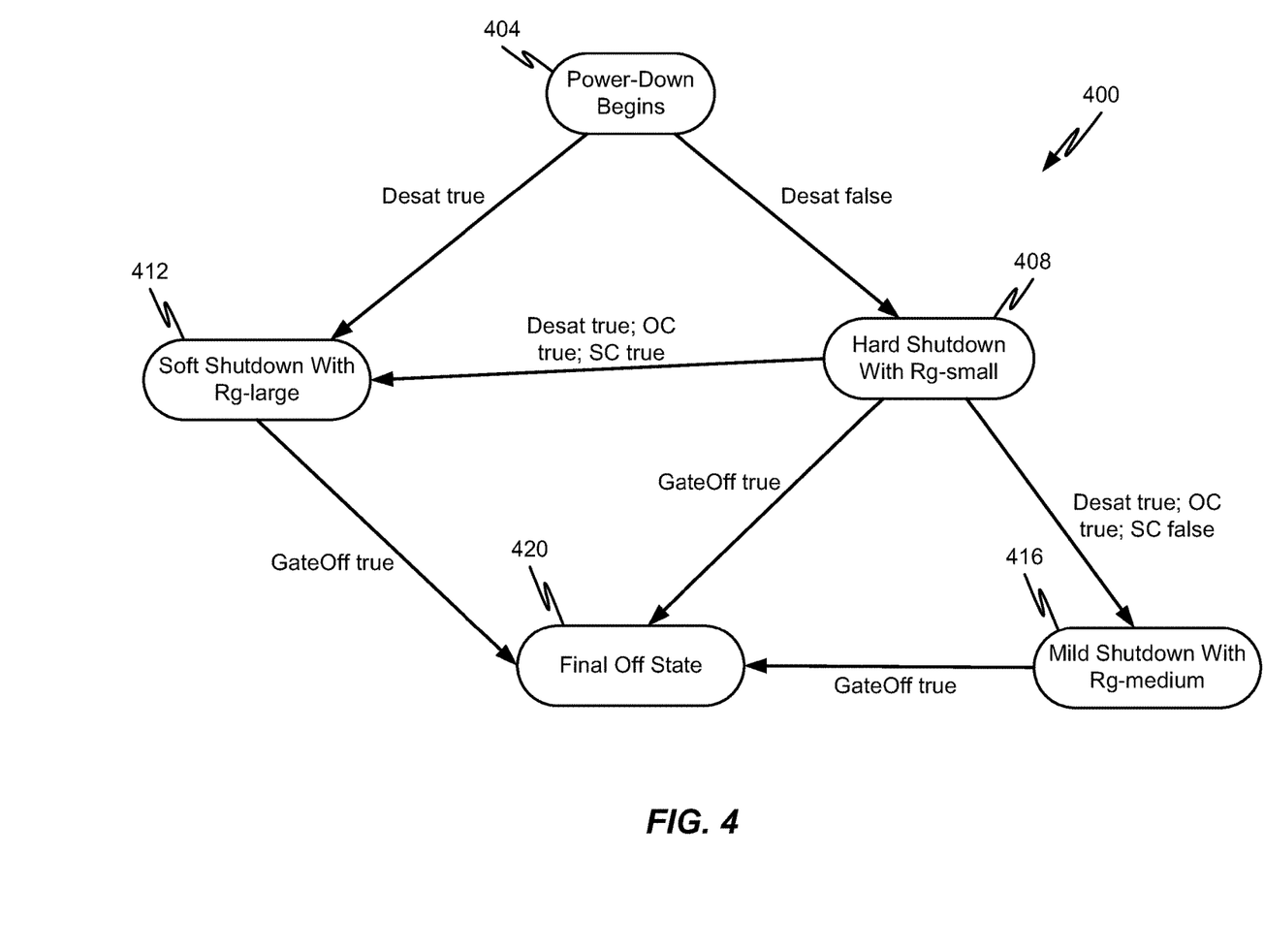
FIG. 4 is a state diagram depicting operations of the adaptive control system of FIG. 3 in accordance with at least some embodiments of the present disclosure.
Figure 5:
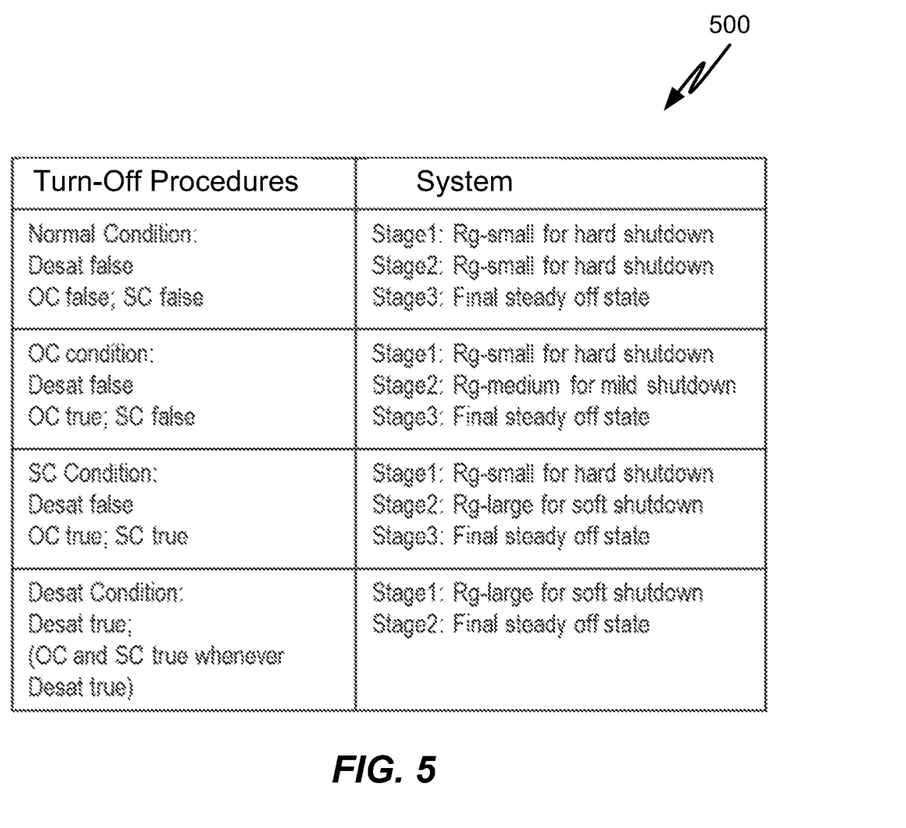
FIG. 5 is a table depicting power-down procedures in accordance with embodiments of the present disclosure.

With reference now to FIGS. 4 and 5, additional details of the behavior of the state machine 308 will be described in accordance with at least some embodiments of the present disclosure. FIG. 4 depicts an illustrative state machine diagram 400 whereas FIG. 5 illustrates an illustrative table 500 that can be used by the controller 304 to control operations of the driver circuit during the IGBT power down (turn-off). It should be appreciated that while the controller 304 is shown to include a state machine 308, which would most likely implement the state diagram 400 depicted in FIG. 4, embodiments of the present disclosure also contemplate the controller 304 utilizing the table 500, either alone or in combination with the state diagram 400.

Referring to FIG. 4, it can be seen that as power-down begins (state 404), the controller 304 determines whether or not a desaturation condition exists. In some embodiments, the controller may first compare the collector-to-emitter voltage Vce received at the second input 328 to a collector-emitter threshold to determine whether or not to transmit a Desat signal from the sensing circuit 312 to the state machine 308. In the event that the desaturation condition exists (e.g., the collector-to-emitter voltage Vce is greater than the collector-emitter threshold), then the controller 304 implements a soft shutdown procedure for the IGBT Q1 in which the large gate resistor Rg-large is connected to the gate of the IGBT Q1 (state 412). Even more specifically, if this desaturation condition is determined to exist, then the output control 320 may cause the third driver 340c to become the active driver in the controller 304, thereby causing the On/Off input to travel through the large gate resistor Rg-large on its way to the gate of the IGBT Q1.

The state machine 308 will remain in this state until the GateOff signal is transmitted from the sensing circuit 312 to the state machine 308. Once the GateOff signal is transmitted (e.g., in response to the sensing circuit 312 detecting that the gate-to-emitter voltage Vge is less than the gate-emitter threshold), then the controller 304 will move to the final Off state (state 420) until the next power-up/down cycle begins.

In the event that the desaturation condition does not exist (e.g., Desat is false), then the state machine may transition to begin shutting down the IGBT Q1 with a hard shutdown in which the small gate resistor Rg-small is connected to the gate of the IGBT Q1 (state 408). More specifically, the output control 320 may cause the first driver 340a to initially connect with the gate of the IGBT Q1 through the small gate resistor Rg-small. The controller 304 will continue driving the IGBT Q1 with the first driver 340a unless the desaturation condition in combination with overload current or short circuit condition is detected. More specifically, if the controller 304 detects both a desaturation condition and short-circuit condition (e.g., in response to detecting a collector-to-emitter current Ice that exceeds the short-circuit current threshold), then the controller 304 transitions to a soft shutdown state (state 412). On the other hand, if only an overload current (but no short-circuit) condition in combination with desaturation condition is detected, (e.g., a collector-to-emitter current Ice is detected below the short-circuit current threshold but above the overload current threshold), then the controller 304 transitions to a mild shutdown state (state 416) where the medium gate resistor Rg-medium is connected to the gate of the IGBT Q1. The controller 304 may then remain in either state 408, state 412, or state 416 until the GateOff state is detected as being true.

Operations of the controller 304 will now be described in relation to the table 500, which, as discussed above, may supplement use of the state diagram 400. When power-down starts, the collector-to-emitter voltage Vce is firstly checked by the sensing circuit 312 to find out whether the IGBT Q1 is in desat status (e.g., there is a short circuit high current with Miller plateau already crossed). If yes, then soft shutdown mode (Rg-large) is selected to keep the collector-to-emitter voltage Vce transient within the IGBT breakdown limit. Otherwise, a hard shutdown mode (Rg-small) is used firstly to minimize the Miller plateau time.

As the collector-to-emitter voltage Vce rises, the Desat signal changes from false to true, meaning that the Miller plateau has come to its end. This causes the controller 304 to decide whether the power down system needs to enter a next state depending on overload current and short-circuit signals.

For a small current condition where both overload current condition and short-circuit condition are false, the system remains in hard shutdown mode (Rg-small) to minimize energy loss. For short-circuit situations where both overload current and short-circuit current conditions are true, soft shutdown mode (Rg-large) is entered; whereas for a simple overload current condition, mild shut down (Rg-medium) is chosen. Therefore, the collector-to-emitter voltage Vce transient is limited within the IGBT's breakdown voltage.

With hard, mild or soft shutdown mode in operation, the IGBT gate voltage gradually decreases, and ultimately a GateOff signal will be set to true. When this does occur, the controller 304 will eventually enter its final steady off state.

Figure 6:
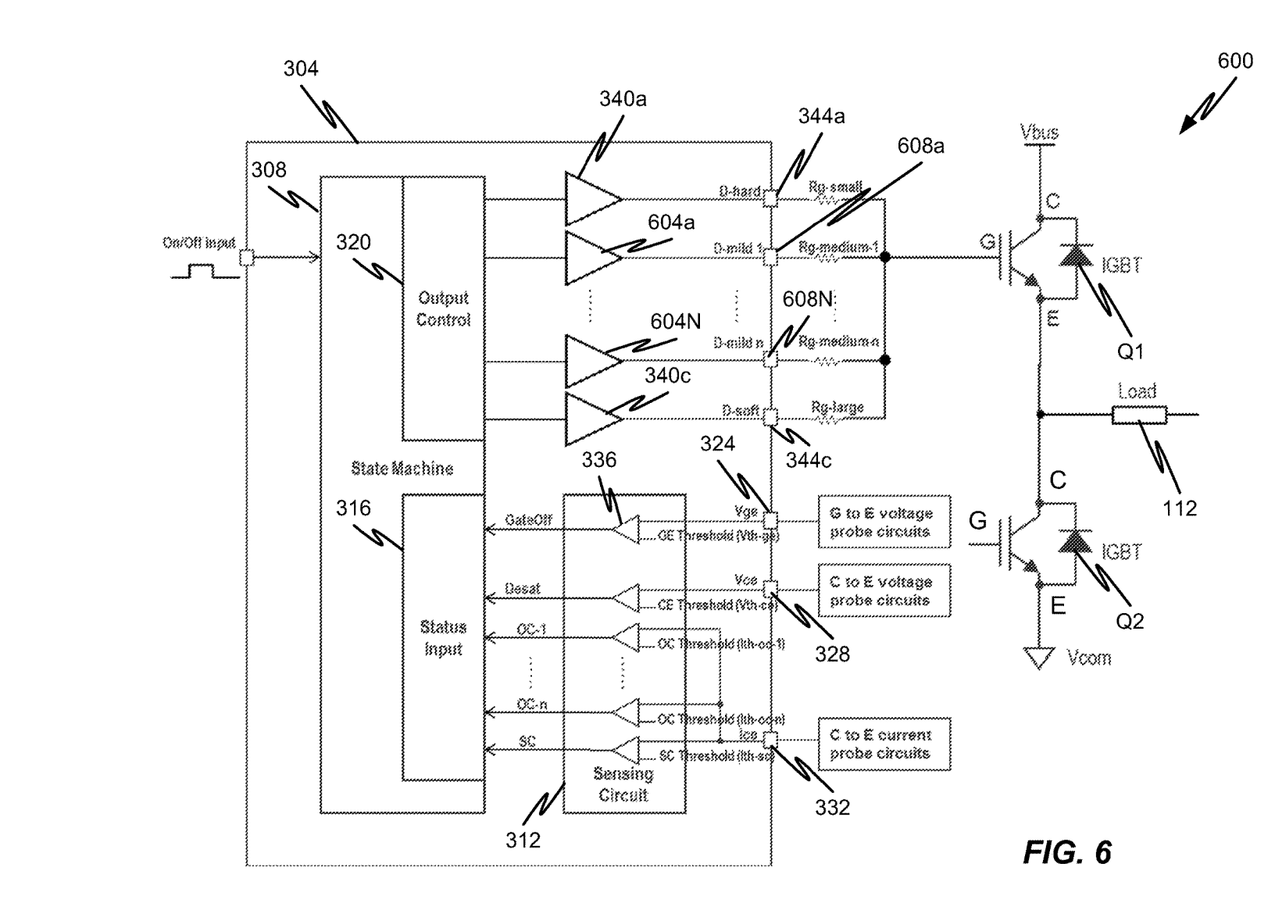
FIG. 6 is a circuit diagram depicting a second adaptive control system in accordance with at least some embodiments of the present disclosure.
Figure 7:
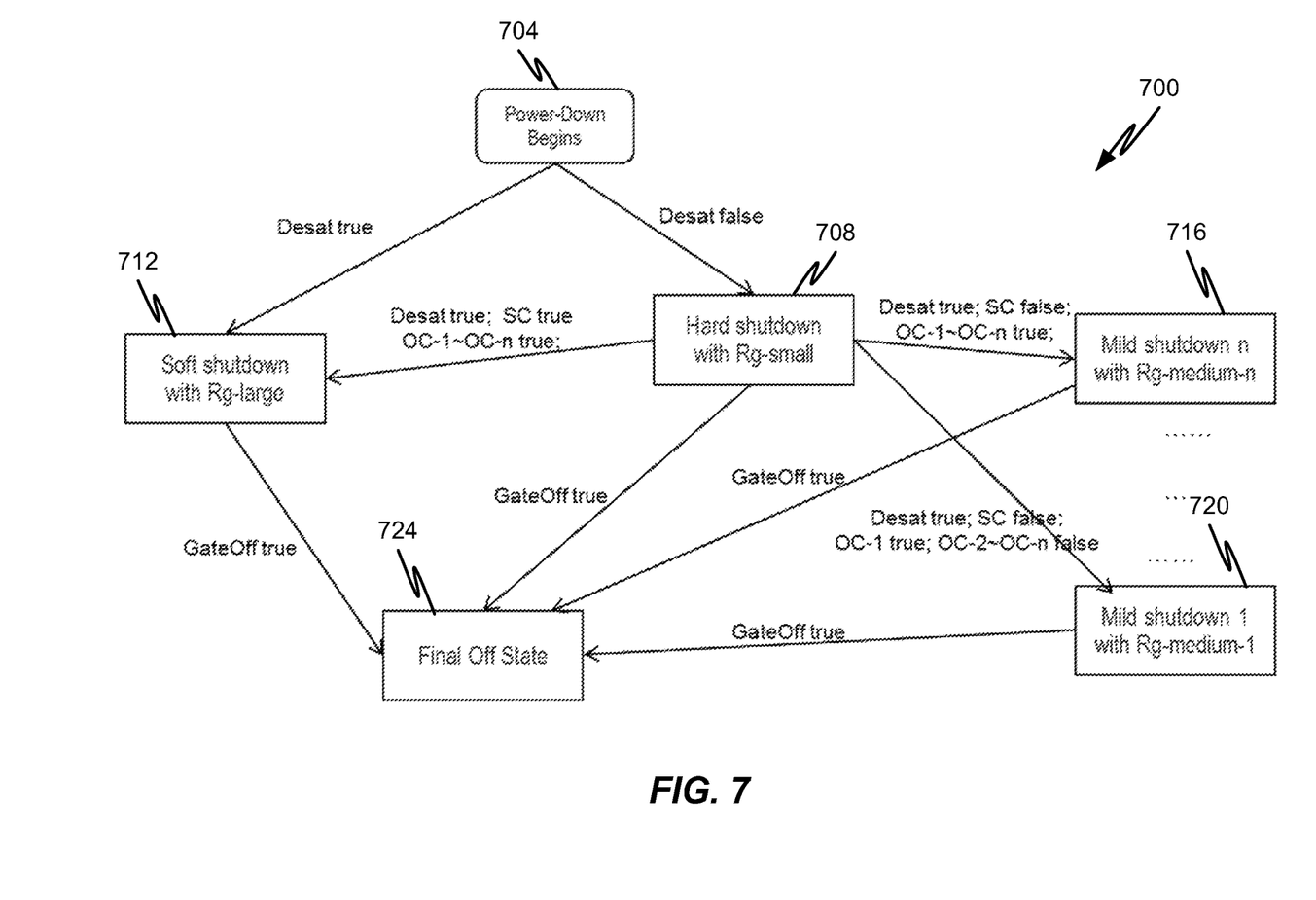
FIG. 7 is a state diagram depicting operations of the adaptive control system of FIG. 6 in accordance with at least some embodiments of the present disclosure.

With reference now to FIGS. 6 and 7, an extension to the controller 304 depicted in FIG. 3 will be described in accordance with at least some embodiments of the present disclosure. The controller 304 still includes a state machine 308 having a status input 316 and an output control 320. The controller 304 of FIG. 6 differs from the controller 304 of FIG. 3, in that the controller 304 of FIG. 6 includes additional comparators in the sensing circuit 312 and additional drivers 604a-604N. The additional drivers 604a-604N are used to implement various degrees of a mild shutdown. More specifically, the different additional drivers 604a-604N can be connected to different medium gate resistors Rg-medium-1 thru Rg-medium-n, via different outputs 608a-608N. As will be discussed in further detail below, the selection of a particular medium driver 604a-604N by the state machine 308 may depend upon a comparison of the collector-to-emitter current Ice to a plurality of different overload current thresholds within the plurality of comparators 336. Each of the different overload current thresholds th-oc-1 thru th-oc-n may be different from one another. In some embodiments, the nth overload current threshold th-oc-n is larger than all of the other overload current thresholds and the first overload current threshold th-oc-1 is the smallest of the overload current thresholds. It should be appreciated, however, that the thresholds may be reversed in their size for the various comparators without departing from the scope of the present disclosure.

Operations of the controller 304 depicted in FIG. 6 are better understood with reference to the state diagram 700 of FIG. 7. In particular, as the power-down begins (state 704), the state machine 308 proceeds to either a soft shutdown (state 712) or a hard shutdown (state 708) depending on whether or not a desaturation condition is detected. If a desaturation condition is detected, then the soft shutdown mode of operation is employed whereby the controller 304 connects driver 340c to the gate of the IGBT Q1 through the large gate resistors Rg-large. The controller 304 will remain in this state until a GateOff signal is detected at the state machine 308, at which point the controller 304 will move to the final off state (state 724).

If, however, no desaturation condition is detected, then the controller 304 implements a hard shutdown (state 708) until a desaturation condition in combination with an overload current and/or short-circuit condition is detected. If a short-circuit condition in combination with desaturation condition is detected, then the controller 304 will transition from state 708 to state 712 to continue implementing the soft shutdown with the large gate resistor Rg-large. If, on the other hand, an overload current condition (but no short circuit) in combination with desaturation condition is detected, then there is a decision to make as to what type of mild shutdown to implement. More specifically, the controller 304 may implement a plurality of different mild shutdown modes depending upon the severity of the overload current condition. If all of the overload current conditions are determined to be true (e.g., the collector-to-emitter current Ice is greater than all of the collector-emitter thresholds), then the nth medium gate resistor Rg-medium-n is connected to the gate of the IGBT Q1 and the nth driver 604N is used to drive the IGBT Q1 for the mild shutdown (state 716). If any of the overload current thresholds are not exceeded by the collector-to-emitter current Ice, then a lesser mild shutdown may be implemented with a different driver and medium gate resistor (state 720). Once the IGBT Q1 is determined to have completed its power down, the GateOff signal will change to true, and the controller 304 will enter the final off state (state 724).

As can be appreciated from the above, embodiments of the present disclosure provide a more efficient and adaptive power down controller 304 for IGBTs. In some embodiments, the controller 304 is able to turn off the IGBT Q1 in an adaptive way to reduce the Miller plateau and delay time, so as to achieve optimum energy loss and minimum system delay. Furthermore, the IGBT current status is being actively monitored from the beginning of IGBT power down. This enables the gate resistor to be adaptively selected to keep the collector-to-emitter voltage Vce within IGBT breakdown voltage, so that better operating efficiency can be achieved without the necessity of an active clamping device.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A circuit, comprising:
    at least one Insulated-Gate Bipolar Transistor (IGBT) having a gate, collector, and emitter;
    a first driver for the at least one IGBT, the first driver comprising a first resistor and being connectable to the gate of the at least one IGBT;
    a second driver for the at least one IGBT, the second driver comprising a second resistor and also being connectable to the gate of the at least one IGBT; and
    a controller that receives at least two separate input signals regarding operating characteristics of the at least one IGBT and based on the at least two input signals decides whether to connect the first driver, the second driver, or both the first and second driver to the gate of the at least one IGBT during power-down of the at least one IGBT, wherein the at least two separate input signals comprise a collector-to-emitter voltage of the at least one IGBT and a collector-to-emitter current of the at least one IGBT, wherein the at least two separate input signals are received at the controller via separate input pins, and wherein the controller utilizes the at least two separate input signals to determine whether a desaturation condition exists for the at least one IGBT and further utilizes the at least two separate input signals to determine whether a short circuit-condition exists for the at least one IGBT, wherein the at least two separate input signals further comprise a gate-to-emitter voltage of the at least one IGBT.

2. The circuit of claim 1, wherein the gate-to-emitter voltage of the at least one IGBT is received by the controller at a separate input pin from the collector-to-emitter voltage and the collector-to-emitter current.

3. The circuit of claim 1, wherein the collector-to-emitter voltage is compared to a first threshold to determine which of the first and/or second driver to connect to the gate of the at least one IGBT during the power-down of the at least one IGBT.

4. The circuit of claim 3, wherein the collector-to-emitter current is compared to both a second threshold and third threshold to determine which of the first and/or second driver to connect or disconnect to the gate of the at least one IGBT during the power-down of the at least one IGBT.

5. The circuit of claim 4, wherein the first threshold comprises a short-circuit current, and wherein the second threshold comprises an overload current.

6. The circuit of claim 5, wherein the gate-to-emitter voltage is also compared to a fourth threshold to determine which of the first and/or second driver to connect or disconnect to the gate of the at least one IGBT during the power-down of the at least one IGBT.

7. The circuit of claim 1, wherein the controller comprises a state machine, wherein the state machine adaptively determines which of the first and/or second driver to connect or disconnect to the gate of the at least one IGBT during power-down of the at least one IGBT.

8. The circuit of claim 1, further comprising:
    a third driver for the at least one IGBT, the third driver comprising a third resistor and also being connectable to the gate of the at least one IGBT; and
    wherein the controller further considers the third driver to connect or disconnect to the at least one IGBT along with the first and/or second drivers based on the at least two separate input signals.

9. The circuit of claim 1, wherein the controller first determines whether the desaturation condition exists for the at least one IGBT and subsequently determines whether the short-circuit condition exists for the at least one IGBT.

10. An adaptive control system for an Insulated-Gate Bipolar Transistor (IGBT), the adaptive control system comprising:
    at least a first driver output that is connected to a gate of the IGBT through a first resistor;

at least a second driver output that is connected to the gate of the IGBT through a second resistor;

a sensing circuit that receives at least a first and second input, the at least a first and second input originating from the IGBT, the first input comprising a collector-to-emitter voltage of the IGBT, the second input comprising a collector-to-emitter current of the IGBT; and control logic that is connected to the sensing circuit and receives the first and second inputs as separate input signals, the control logic being configured to connect the at least a first driver output and/or the at least a second driver output to the gate of the IGBT based on a combination of the collector-to-emitter voltage and the collector-to-emitter current received from the sensing circuit, wherein the control logic checks the collector-to-emitter voltage to determine whether a desaturation state exists for the IGBT and either implements a soft shutdown mode using a first resistance of the first resistor to maintain the collector-to-emitter voltage transient or implementing a hard shutdown mode using a second resistance of the second resistor that is smaller than the first resistance to minimize a Miller plateau time depending upon whether or not the desaturation state is determined to exist for the IGBT, wherein the sensing circuit further provides a third input to the control logic, wherein the control logic is further configured to connect the at least a first driver output and/or the at least a second driver output to the gate of the IGBT based on a combination of the collector-to-emitter voltage, the collector-to-emitter current, and the third input received from the sensing circuit, and wherein the third input comprises a gate-to-emitter voltage of the IGBT.

11. The adaptive control system of claim 10, wherein the control logic causes the at least a first driver output to connect with the gate of the IGBT in response to detecting a first state based on the input received from the sensing circuit and wherein the control logic causes the at least a second driver output to connect or disconnect with the gate of the IGBT in response to detecting a second state based on the input received from the sensing circuit.

12. The adaptive control system of claim 10, wherein the control logic comprises a state machine.

13. An adaptive control system for an Insulated-Gate Bipolar Transistor (IGBT), the adaptive control system comprising:
at least a first driver output that is connected to a gate of the IGBT through a first resistor;
at least a second driver output that is connected to the gate of the IGBT through a second resistor;
a sensing circuit that receives at least a first and second input, the at least a first and second input originating from the IGBT;
control logic that is connected to the sensing circuit, the control logic being configured to connect the at least a first driver output and/or the at least a second driver output to the gate of the IGBT based on the inputs received from the sensing circuit; and
at least a third driver output that is connected to the gate of the IGBT through a third resistor, wherein the control logic causes the at least a first driver output to connect with the gate of the IGBT in response to detecting a first state based on the input received from the sensing circuit, wherein the control logic causes the at least a second driver output to connect or disconnect with the gate of the IGBT in response to detecting a second state based on the input received from the sensing circuit, and wherein the control logic causes the at least a third driver output to connect or disconnect with the gate of the IGBT in response to detecting a third state based on the input received from the sensing circuit.

14. The adaptive control system of claim 13, wherein the control logic causes the at least a first driver output to connect with the gate of the IGBT in response to detecting a first state based on the input received from the sensing circuit and wherein the control logic causes the at least a second driver output to connect or disconnect with the gate of the IGBT in response to detecting a second state based on the input received from the sensing circuit.

15. The adaptive control system of claim 13, wherein the control logic comprises a state machine.

16. The adaptive control system of claim 15, wherein the state machine adaptively determines which of the first and/or second driver output to connect or disconnect to the gate of the IGBT during power-down of the IGBT.

17. A method of operating an Insulated-Gate Bipolar Transistor (IGBT) control system, the method comprising:
receiving a first input that comprises a collector-to-emitter current of the IGBT;
receiving a second input that comprises a collector-to-emitter voltage of the IGBT, the second input being received at a different input pin than the first input;
comparing the first input to a first threshold;
comparing the second input to a second threshold;
based on the comparison of both the first input to the first threshold and the comparison of the second input to the second threshold, determining whether to connect a first driver and/or a second driver to a gate of the IGBT, wherein the first driver, when connected to the gate of the IGBT, connects a first resistor to the gate of the IGBT, wherein the second driver, when connected to the gate of the IGBT, connects a second resistor to the gate of the IGBT, wherein the first resistor is larger than the second resistor, and wherein the first resistor and second resistor are selectively connected to the gate of the IGBT depending upon whether a desaturation condition or short-circuit current condition is detected for the IGBT;
receiving a third input that comprises a gate-to-emitter voltage of the IGBT;
comparing the third input to a third threshold; and
including the comparison of the third input to the third threshold with the consideration of whether to connect the first driver or the second driver to the gate of the IGBT.

18. The method of claim 17, wherein control logic causes the first driver to connect with the gate of the IGBT in response to detecting the desaturation condition for the IGBT based on the input received from a sensing circuit and wherein the control logic causes the second driver to connect or disconnect with the gate of the IGBT in response to detecting the short-circuit current condition for the IGBT based on the input received from the sensing circuit.

19. The method of claim 18, wherein the control logic comprises a state machine.

20. The method of claim 17, wherein the first threshold comprises a short-circuit threshold, and wherein the second threshold comprises an overload threshold.

* * * * *